United States Patent [19]
Fairbanks

[11] Patent Number: 6,144,226
[45] Date of Patent: Nov. 7, 2000

[54] CHARGE SHARING SELECTORS WITH ADDED LOGIC

[75] Inventor: Scott M. Fairbanks, Mountain View, Calif.

[73] Assignee: Sun Microsystems, Inc., Palo Alto, Calif.

[21] Appl. No.: 09/227,229

[22] Filed: Jan. 8, 1999

[51] Int. Cl.[7] .............................................. H03K 19/094
[52] U.S. Cl. ........................... 326/113; 326/112; 327/407
[58] Field of Search ................................... 326/112, 113, 326/49; 327/407, 408, 415, 416

[56] References Cited

U.S. PATENT DOCUMENTS

| | | | |
|---|---|---|---|
| 5,742,182 | 4/1998 | Sutherland | 326/49 |
| 5,783,963 | 7/1998 | Garnett et al. | 327/408 |
| 5,828,236 | 10/1998 | Zhou | 327/408 |
| 6,023,175 | 2/2000 | Nunomiya et al. | 327/407 |

*Primary Examiner*—Michael Tokar
*Assistant Examiner*—Don Phu Le
*Attorney, Agent, or Firm*—Townsend and Townsend and Crew LLP; Philip H. Albert

[57] ABSTRACT

The selector circuit rapidly steers an event from a single input to one of two outputs depending on the binary value of a data signal controlling the selector, where events are received at an event input. A selection value, placed at a control input causes the selector circuit to steer the event to one of the outputs. For each change of value at the event input, one or the other of the outputs will change. Which output changes is determined by the selection value applied to the control input. The selector circuit uses variable or dynamic capacitances at the outputs to control which one of the outputs changes in response to an input event. Each node of the selector circuit includes a true line and a complement line. Pass gates are used to either couple the true lines of the outputs together or to couple the true line of each output and the complement line of the other output. The input lines can either control the pass gates or additional logic can be provided, in place of the pass gates, to efficiently include precursor input logic within the selector circuit.

5 Claims, 7 Drawing Sheets

CHARGE SHARING SELECTORS WITH ADDED LOGIC

RELATED APPLICATIONS

This application is related to U.S. patent application Ser. No. 09/227,223, entitled "Charge Sharing Selectors", which was filed on Jan. 8, 1999. That application is commonly owned with the present application and is incorporated by reference herein for all purposes.

FIELD OF INVENTION

This invention relates to logic circuits and in particular to an improved selector circuit for use with event logic circuits and combinatorial logic.

BACKGROUND OF THE INVENTION

One known technique for conveying information within computer systems, especially asynchronous computers, is through the use of "events," where the occurrence of predetermined conditions constitute the event. For example, where the predetermined conditions are the transition on a signal line from one state (such as a voltage level) to another state ("transition signalling"), each change in state of the signal would constitute an event. If a system uses a single conductor for transmission of events, an event is indicated by the change in state on that conductor. For example, a change in state could be indicated when the voltage on the conductor is either raised or lowered from its previous condition. The resulting edge, rising or falling, denotes the occurrence of an event. For example, the conductor may be initially at a low potential, such as 0 volts. If a potential source then is switchably coupled to the conductor, the potential of the conductor changes to a different potential, signalling an event. When the potential source is disconnected, the conductor returns to its 0 volt state, signalling another event. The rising edge and the falling edge both designate the occurrence of events. In other systems, an event might be indicated by only the falling edges or only the rising edges.

Whatever the predetermined conditions are, there are several logic components that are commonly found in event-driven systems. Once such logic component is a "selector." The nodes of a selector comprise two or more outputs, an event input and a control input. The selector is used to steer an event from the event input to one of the outputs, where the particular output depends on the state of a control signal applied to the control input. For example, with a binary selector, an event presented on an event input to a selector circuit is steered to one of two outputs for that selector circuit, depending upon the state of a binary control signal applied to the control input of the selector circuit. If the control signal is in a first binary state, then the input event to the selector will cause an output event on one output, and if the control signal is in the other binary state, then the input event will cause an output event on the other output.

The general functionality of selector circuits is well known. See, for example, U.S. Pat. No. 5,742,182, issued to Sutherland and assigned to the assignee of the present application, which is incorporated herein by reference for all purposes (hereinafter referred to as "Sutherland"). The selector circuit described therein is useful for many applications, but often a circuit design is constrained to require a high-speed response from a selector and is constrained to a low component count.

As with many circuits employing selectors, speed and chip area are at a premium. This invention provides an improved selector circuit, for high-speed and low component count uses as well as improvements in speed and chip area usage.

SUMMARY OF THE INVENTION

The present invention provides a selector circuit useful for high-speed operation with a low component count. A selector circuit is a logic element used in digital systems, particularly those employing event logic. The present invention may be used in many types of digital circuits and systems, for example, computer systems or microprocessors.

The selector circuit of this invention provides for rapidly steering an event from a single input to one of two outputs depending on the binary value of a data signal controlling the selector. In operation, events are received at an event input. A selection value, placed at a control input, causes the selector circuit to steer the event to one of the outputs. For each change of value at the event input, one or the other of the outputs will change. Which output changes is determined by the selection value applied to the control input. One embodiment of a selector circuit according to the present invention uses variable capacitances at the outputs to control which of the outputs changes in response to an input event.

If the selector circuit uses complementary signalling, each node of the selector circuit includes a true line for carrying a true signal and a complement line for carrying a complement signal. Pass gates are used to either couple the true lines of the outputs together and couple the complement lines of the outputs together or to couple the true line of one output to the complement line of the other output and couple the true line of the other output to the complement line of the one output. Where a circuit contains logic circuitry prior to a selector ("precursor logic"), the selector and the precursor logic can be combined by replacing the pass gates with the counterparts to the precursor logic.

BRIEF DESCRIPTION OF THE DRAWINGS

FIG. 1 is a block diagram of a selector circuit.

FIG. 4 is a set of schematic diagrams for examples of precursor logic that are combinable with the selector circuit of FIG. 3.

DESCRIPTION OF THE SPECIFIC EMBODIMENTS

In the figures, like elements are labelled with like numbers and different instances of like elements are labelled with like numbers and different parenthetical numbers or letters.

Herein, the following terminology is used: a "node" is an input into, or an output from, a circuit. Where complimentary signalling is used, a node comprises a true line carrying a true signal and a complement line carrying a complement signal. Thus, when complementary signalling is used, a signal comprises a true signal and a complement signal. As is well known in the art of complementary signalling, a true signal and its corresponding complement signal are normally (i.e., when the signals are stable) opposites. A true signal is designated herein by a capital letter, such as "A", and its corresponding complement signal by the capital letter with an overbar, such as "$\overline{A}$".

Figure 1A:
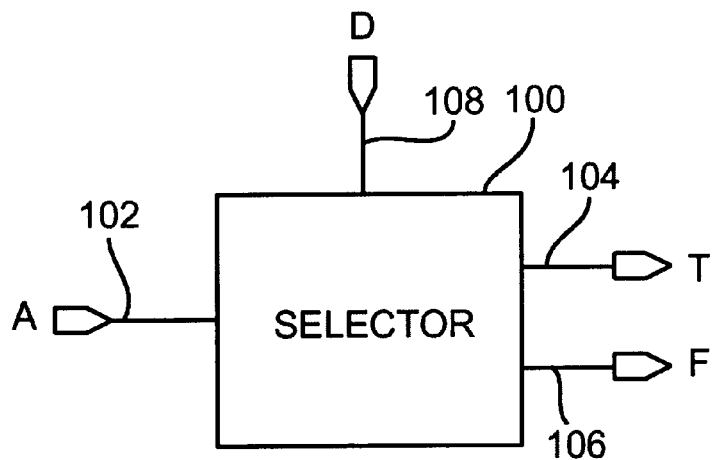
in FIG. 1(a), each input and output is shown by a single line.

FIG. 1(a) is a block diagram of a selector circuit (or "selector" for short) 100 having an input A 102, two outputs T 104 and F 106 and a control input D 108. As with other selectors, in the operation of selector 100, an event occurring on input A 102 is steered from input A 102 to one of outputs T 104 and F 106. Specifically, in this example, if control input D 108 is high, then events on input A 102 cause events on output T 104 and if control input D 108 is low, then events on input A 102 cause events on output F 106. It should be noted that while "T" and "F" are commonly used to denote "True" and "False," respectively, and control input D might symbolize, in a particular circuit, a true/false state of a signal, it should be understood that selector 100 would work equally well regardless of what the high or low signals on control input D represented.

Figure 1B:
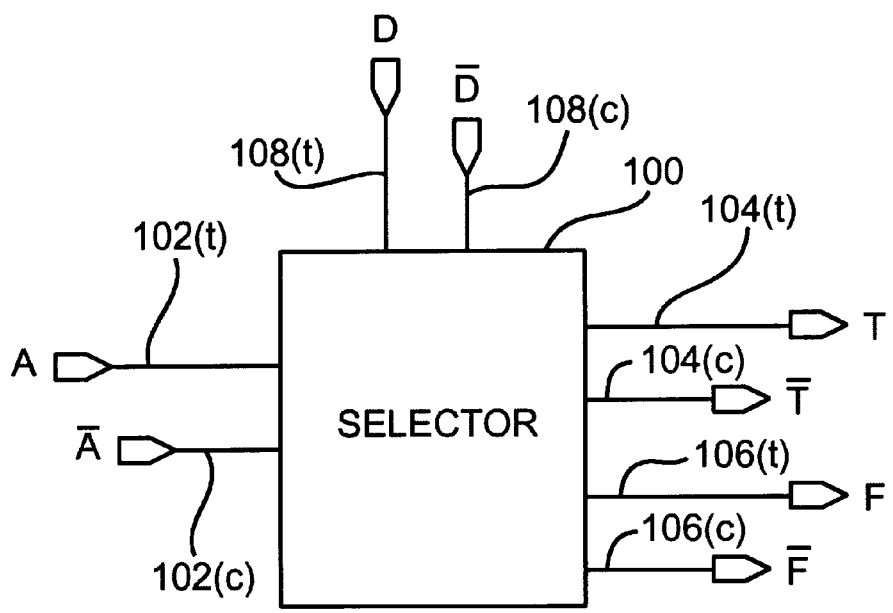
in FIG. 1(b), each input and output is shown with a true line and a complement line.

FIG. 1(b) is a block diagram of selector circuit 100 showing more detail for its external connections. In particular, each of the external nodes 102, 104, 106, 108 includes two lines: a true signal line (e.g., 102(t), 104(t), 106(t), 108(t)) and a complement signal line (e.g., 102(c), 104(c), 106(c), 108(c)).

Figure 2:
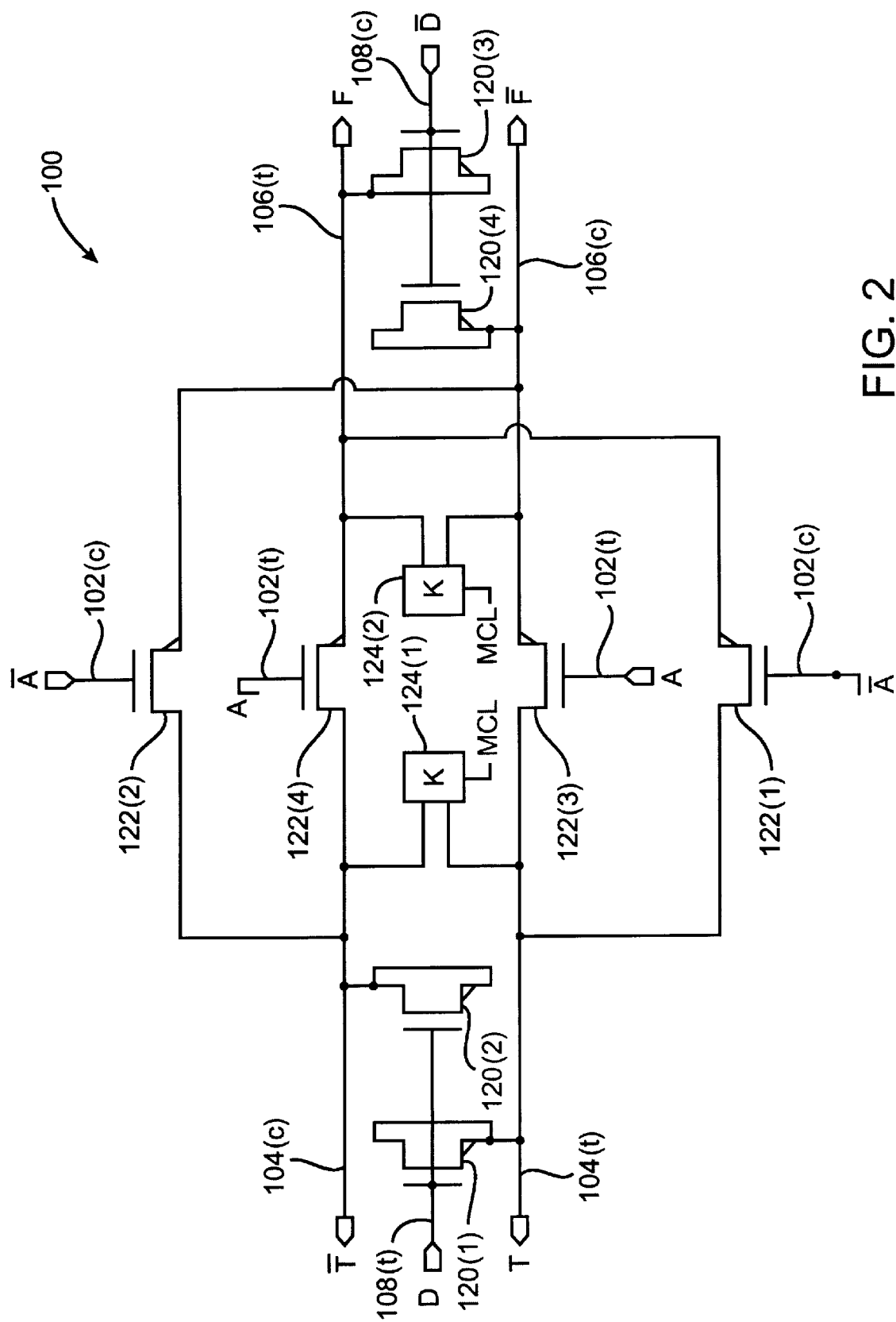
FIG. 2 is a schematic diagram of one embodiment of a selector circuit, for complementary signals, according to the present invention.

FIG. 2 is a schematic of an embodiment of a selector according to the present invention. Although a particular selector is used to explain aspects of the present invention here, other selectors can also be used.

As shown in FIG. 2, selector 100 comprises four voltage variable capacitors (VVC's) 120, four pass gates 122 and two keepers 124. In the circuit shown in FIG. 2, a VVC is implemented by a MOS transistor (in this case, an NMOS transistor) with its source and drain tied together and tied to one of the outputs and the gate of the MOS transistor tied to a control input. VVC 120(1) is coupled to line T, VVC 120(2) is coupled to line $\overline{T}$, VVC 120(3) is coupled to line F, and VVC 120(4) is coupled to line $\overline{F}$. The gates of VVC's 120(1) and 120(2) are coupled to line D, while the gates of VVC's 120(3) and 120(4) are coupled to line $\overline{D}$. As for the pass gates 122, pass gate 122(1) is coupled between line T and line F, pass gate 122(2) is coupled between line $\overline{T}$ and line $\overline{F}$, pass gate 122(3) is coupled between line T and line $\overline{F}$, and pass gate 122(4) is coupled between line $\overline{T}$ and line F. The gates of pass gates 122(1) and 122(2) are coupled to line $\overline{A}$, while the gates of pass gates 122(3) and 122(4) are coupled to line A. In an alternative embodiment of a VVC (not shown), the source/drain of the MOS transistor is tied to the control input line and the gate of the MOS transistor is tied to the output line.

Keepers 124 attempt to maintain the voltages at the output signal lines and their complements, but they are weakly driven keepers. Being weakly driven keepers, their maintenance of the voltages can be overridden by moderate countereffort. Keeper 124(1) is coupled between line T and line $\overline{T}$, while keeper 124(2) is coupled between line F and line $\overline{F}$. Keepers 124 include master clear (MCL) inputs, to allow them to be set to known states.

In operation, when A is high, the pass gates connect line T to line $\overline{F}$ and line $\overline{T}$ to line F, so the values of T and F outputs are different. When A is low, the pass gates connect line T to line F and line $\overline{T}$ to line $\overline{F}$, so the values of the T and F outputs are the same.

Just before an event arrives at input A, suppose line D is low (and line $\overline{D}$ is high) and A is low (so T and F are the same). At that point, having D applied to the gates of VVC's 120(1)–(2) results in them placing less capacitance on lines T/$\overline{T}$ than VVC's 120(3)–(4) place on lines F/$\overline{F}$, since the latter VVC's have their gates coupled to $\overline{D}$, which is high. As a result, when an event does arrive at input A (i.e., a transition from low to high), line $\overline{T}$ is coupled to line F and line T is coupled to line $\overline{F}$. Because of this coupling, the T and F outputs must go from being the same to being opposite. Since the T/$\overline{T}$ lines have less capacitance on them, output T changes state while output F remains the same, thus steering the event (a transition) from input A to output T.

The variable voltage capacitances are provided by the gate capacitance of the NMOS devices. When the voltage on the gate of an NMOS device increases, its gate capacitance increases. Therefore, in selector 100, when control input line D is high, the capacitance on the T/$\overline{T}$ outputs is greater than the capacitance on the F/$\overline{F}$ outputs. When the pass gates switch, the charge on the T/$\overline{T}$ outputs is shared with the charge on the F/$\overline{F}$ outputs to which they are connected. Because the T/$\overline{T}$ outputs have more charge on them, due to the higher capacitance, the charge sharing will affect the voltage on those outputs less severely than on the F/$\overline{F}$ outputs. As a result, the logic value on the T output will be maintained while the logic value of the F output will switch.

Keepers 124 oppose any changes in state of their respective outputs, but keeper 124(1) is overcome by the larger capacitance of VVC's 120(3) and 120(4) when pass gates 122(3) and 122(4) are turned on. Once keeper 124(1) is overcome, it then stabilizes output T to its new value. During the transition, keeper 124(2) works to keep output F from changing, and while lines F/$\overline{F}$ dip as the charge on those lines is shifted over to lines T/$\overline{T}$, they don't change state and keeper 124(2) stabilizes those lines at the steady state they were at before the transition.

Other selectors can be used in a similar fashion, so long as they couple true lines and false lines through passgates. For example, the selectors shown in Sutherland could be used instead of the selector shown in FIG. 2

Often, the critical path in an asynchronous logic circuit is the selectors, and therefore, using selector circuit 100 can increase the processing speed of such a logic circuit. If the event input to the selector circuit is the output of some logic function, referred to herein as "precursor" logic, the precursor logic can be combined with the selector circuit with little extra cost in terms of delay or setup time, thereby reducing the overall delay and/or setup time relative to a circuit with separate selectors and precursor logic. The precursor logic functions are implemented by pass gates that connect output lines together as indicated by the precursor logic function. Setup time refers to the amount of time a circuit must wait for its inputs and/or outputs to be reliably unambiguous.

Figure 3:
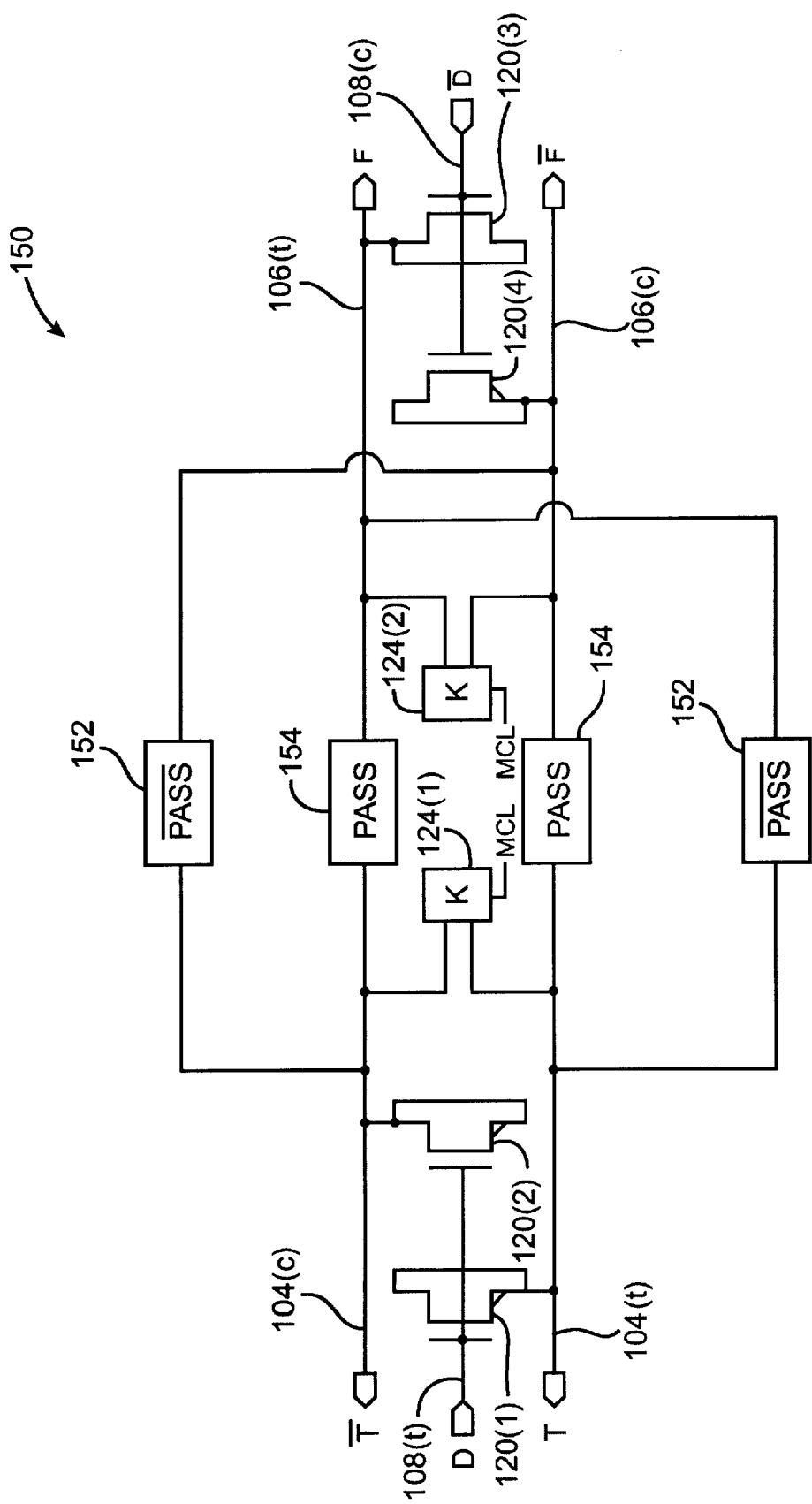
FIG. 3 is a generalized schematic diagram of a selector circuit, which includes pass gate logic for implementing precursor logic functions.

A generalized example of a selector 150 with pass gate logic 152, 154 is shown in FIG. 3. Pass gate logic 152 corresponds to pass gate 122(1) or 122(2) in selector circuit 100. As pass gates 122(1)–(2) are gated by the $\overline{A}$ signal, pass gate logic 152 is labelled "$\overline{PASS}$". Likewise, pass gate logic 154 corresponds to pass gate 122(3) or 122(4) in selector circuit 100 and is labelled "PASS".

Figure 4A:
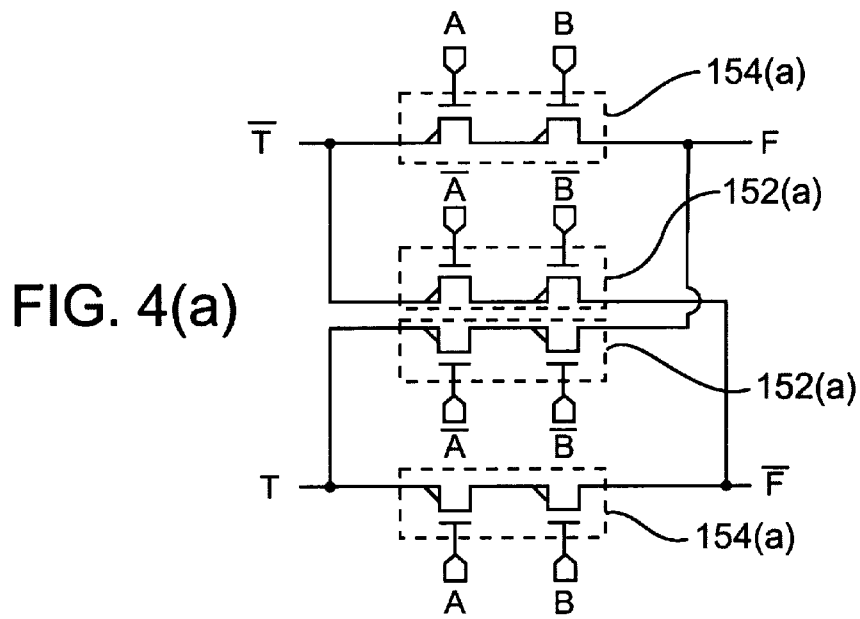
FIG. 4(a) is a schematic diagram for a two-input rendezvous component.

FIG. 4 shows some examples of pass gate logic that might be used as pass gate logic 152, 154. FIG. 4(a) shows pass gate logic 152(a) comprising two series pass gates gated by signals $\overline{A}$ and $\overline{B}$, respectively, and pass gate logic 154(a) comprising two series pass gates gated by signals A and B, respectively. This logic adds a "Muller-C", or rendezvous, function to the input of selector circuit 150. A rendezvous function is so named because it waits for an event on both the A input and the B input to arrive before it causes an event on the output.

As can be seen from FIG. 3 and FIG. 4(a), selector circuit 150 would not output an event until an event is received on both the A input and the B input. Once both the A and B events are received, an event is output on either the T or F output of selector circuit 150. The output event is placed on the T output if D is HI, otherwise, if D is LO, the output event is placed on the F output.

Figure 4B:
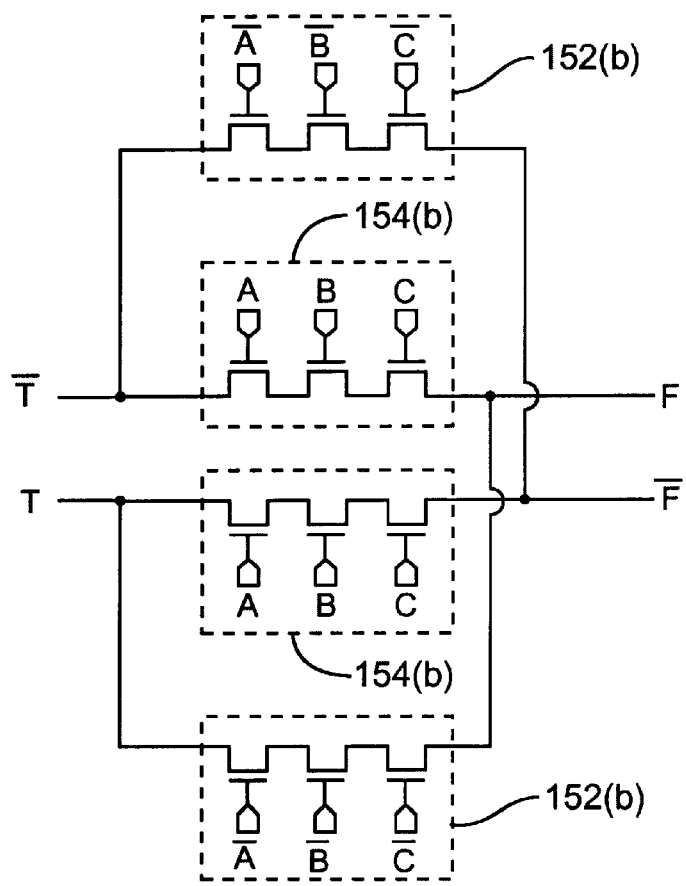
FIG. 4(b) is a schematic diagram for a three-input rendezvous component.
Figure 4C:
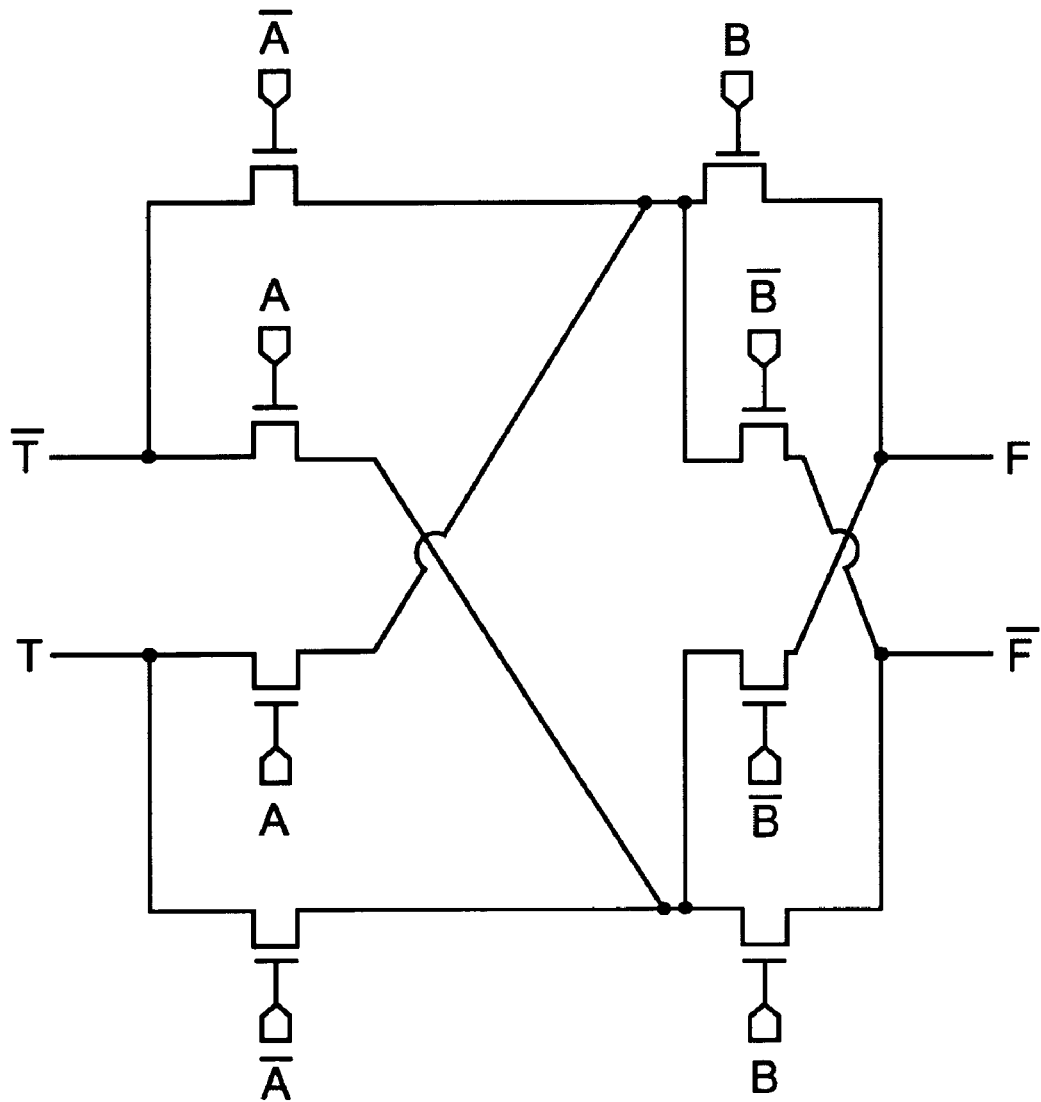
FIG. 4(c) is a schematic diagram for an XOR component.

FIG. 4(b) shows another possible set of pass gate logic circuits 152(b), 154(b). Those circuits 152(b), 154(b) provide for a three-input rendezvous circuit, where an output event occurs only after three input events are received. FIG. 4(c) shows yet another variation of pass gate logic, where the logic represents an exclusive OR (XOR) of the input events. It should be understood that the pass gate logic is not limited to a Muller-C, rendezvous or XOR element, but can be used to implement any n-input (n≧2) combinatorial logic function.

Figure 5:
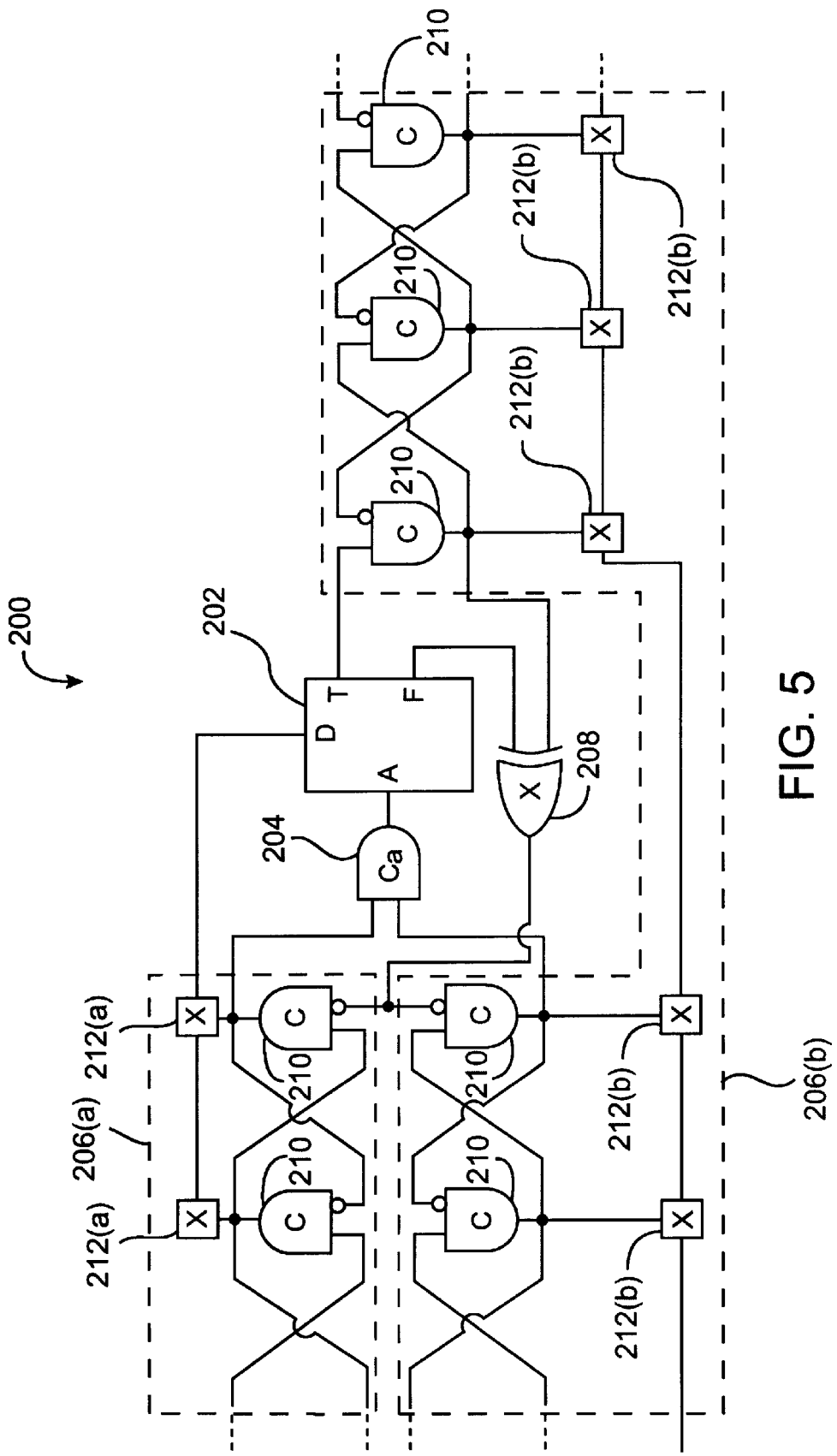
FIG. 5 is a schematic diagram of a micropipeline circuit using precursor logic and a selector circuit as an example of the use of precursor logic.
Figure 6:
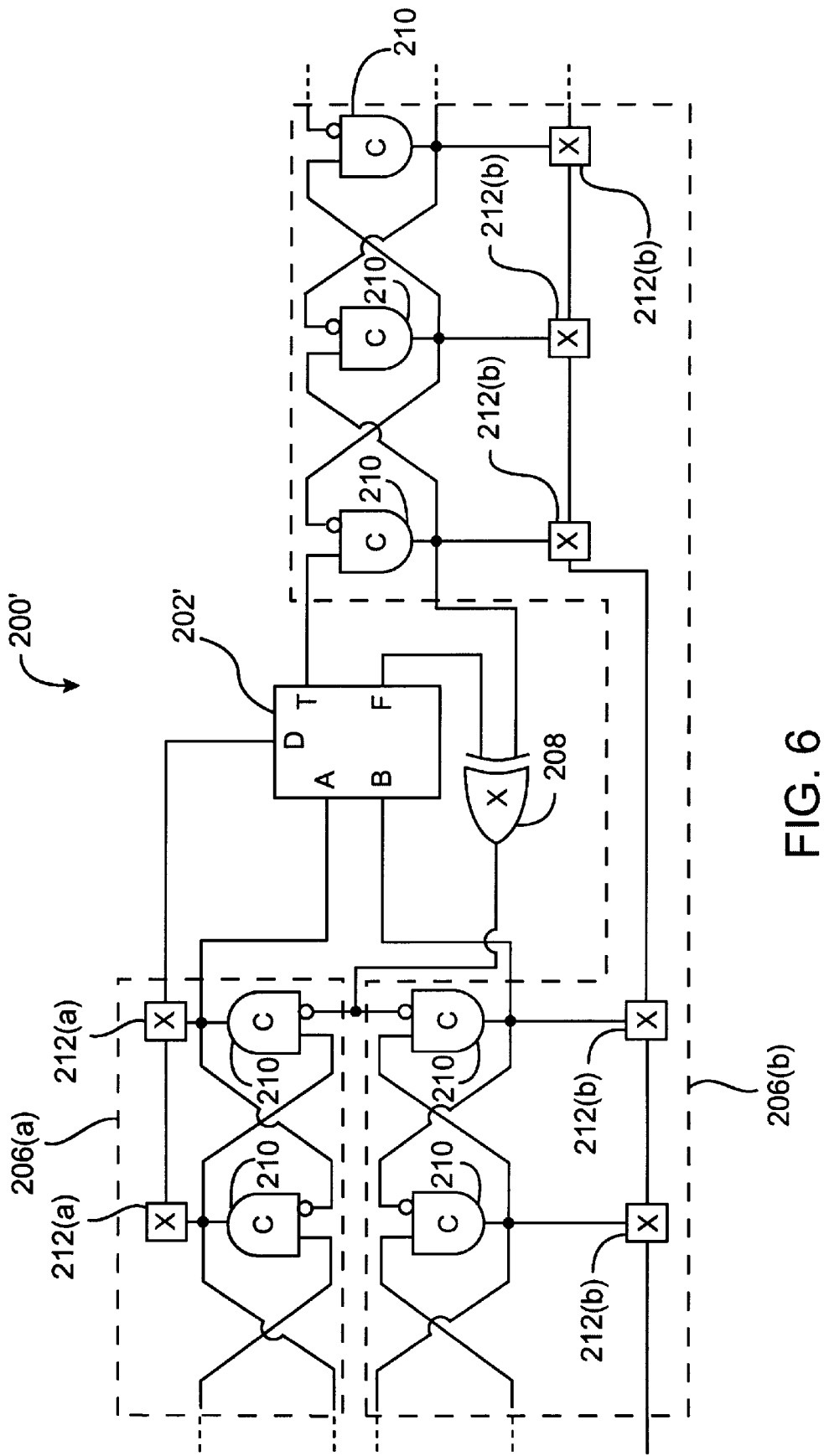
FIG. 6 is a schematic diagram of a micropipeline circuit wherein the precursor logic is included in the selector circuit.

FIGS. 5–6 illustrate one practical example of how the inclusion of precursor logic in place of the pass gates of a charge sharing selector reduces the overall delay in a circuit. The circuit shown in FIG. 5 is a drop circuit 200 for handling conditional drops in an asynchronous micropipeline. A selector 202 and a Muller-C element 204 are used to conditionally drop data from a micropipeline 206(b) with data in a micropipeline 206(a) indicating which bits are to be dropped from micropipeline 206(b). Specifically, each stage of micropipeline 206(a) carries one bit of data that bit indicates whether or not data in a corresponding stage in micropipeline 206(b) is dropped as the data flows past selector 202. In this example, data is level encoded, but in other variations, data could be encoded by two-wire events or pulses. Each stage of both micropipelines is shown comprising a Muller-C element 210 and a data storage element 212. In the case of micropipeline 206(a), the data storage elements 212(a) are single bit storage elements, but in the case of micropipeline 206(b), the number of bits of storage in each of data storage elements 212(b) depends on the data being carried in micropipeline 206(b).

To perform the conditional drop process, the data storage element 212(a) of the last stage of micropipeline 206(a) connects to the control input (D) of selector 202. When the control tokens of micropipelines 206(a) and 206(b) arrive at Muller-C element 204, a control token is either passed forward through selector 202, to the first stage of micropipeline 206(b) past selector 202, or the control token is steered backward through an XOR element 208. The destination of the control token is determined by the value of the bit at the D control input, which is supplied by the last stage of micropipeline 206(a). If the control token is steered forward, a typical micropipeline data exchange occurs. If the control token is steered backwards, the data in the last stage of micropipeline 206(b) before selector 202 is overwritten by the next data written to the data storage element 212(b) of that stage.

In other words, a control token and its corresponding data are effectively dropped from the micropipeline. In drop circuit 200, there is a full C-element gate delay after the control tokens from micropipelines 206(a) and 206(b) meet at Muller-C element 204, before the control token is steered forward through the T output of selector 202 or is dropped through the action of XOR element 208 on the F output of selector 202.

FIG. 6 shows a similar circuit, drop circuit 200', which performs a similar function as drop circuit 200, but with less delay because the function of Muller-C element 204 in drop circuit 200 (FIG. 5) is incorporated into the pass gates of a selector 202' (FIG. 6). In drop circuit 200', the control token is steered to either the T output or the F output of selector 202' as soon as the last control token from micropipeline 206(a) or 206(b) arrives. Selector 202 can be modified in many different ways to form selector 202', but one such way is to use the circuits 152(a), 154(a) shown in FIG. 4(a) for pass gate logic 152, 154 in selector 150 shown in FIG. 3.

In a prototype chip where the delay of the drop circuit affected the overall delay of the prototype chip, the cycle time of the chip using drop circuit 200 was about 8 gate delays. Using drop circuit 200' reduced the bottleneck so that the chip cycled at about 7 gate delays.

In summary, a novel selector circuit with a capability of combining precursor logic has now been described, including several variations. The foregoing description of preferred embodiments of the invention has been presented for the purposes of description. It is not intended to be exhaustive or to limit the invention to the precise form described, and modifications and variations are possible in light of the teaching above. For example, given the explanation above, it will be appreciated that selector circuits can be designed using the principles of this invention which select an input event to pass to any one of a group of output lines in response to a multiple bit control signal. Furthermore, while charge sharing selectors are shown constructed from NMOS devices, they can be built using any suitable device technology, such as PMOS, SOI, GAs, etc., that can be used to implement asynchronous circuits and the like.

What is claimed is:

1. A selector circuit, for providing an input event to a selected output of a plurality of outputs, wherein the selected output is selected based on a state of a control input and is accepted from an input according to a precursor logic function, the selector circuit comprising:
    a plurality of variable capacitance elements, wherein each of the variable capacitance elements is coupled to a different output of the plurality of outputs; and
    a plurality of pass logic elements coupling the input to the plurality of variable capacitance elements such that a capacitance of the variable capacitance element varies based on a pass logic result in sufficient variation to transfer an event from the input to the selected output without transferring the event to an unselected output, wherein the pass logic result is the precursor logic function applied to the input.

2. A selector circuit of claim 1, wherein the state of the input comprises N input states, where N is an integer greater than or equal to two, and the precursor logic function is an N-input combinatorial logic function.

3. A selector circuit of claim 2, wherein N=2 and the N-input combinatorial logic function is an input rendezvous function.

4. A selector circuit of claim 2, wherein N=3 and the N-input combinatorial logic function is a three-input rendezvous function.

5. A selector circuit of claim 2, wherein N=2 and the N-input combinatorial logic function is an XOR function.

* * * * *